(12) United States Patent
Yang et al.

(10) Patent No.: US 6,633,202 B2
(45) Date of Patent: Oct. 14, 2003

(54) PRECISION LOW JITTER OSCILLATOR CIRCUIT

(75) Inventors: Wei Yang, Burlington (CA); Frederick Edward Sykes, Burlingotn (CA)

(73) Assignee: Gennum Corporation (CA)

( * ) Notice: Subject to any disclaimer, the term of this patent is extended or adjusted under 35 U.S.C. 154(b) by 295 days.

(21) Appl. No.: 09/833,376

(22) Filed: Apr. 12, 2001

(65) Prior Publication Data

US 2002/0167363 A1 Nov. 14, 2002

(51) Int. Cl.$^7$ ................................................. H03B 5/24
(52) U.S. Cl. ............................ 331/57; 331/74; 331/175; 331/179
(58) Field of Search ........................... 331/44.75, 57.75, 331/116 R, 116 FE, 117 D, 117 R, 117 FE, 173, 177 R, 179, 175

(56) References Cited

U.S. PATENT DOCUMENTS

| 4,119,814 A | 10/1978 | Harless |
| 4,142,072 A | 2/1979 | Berland |

(List continued on next page.)

FOREIGN PATENT DOCUMENTS

| EP | 89101149.6 | 8/1989 |
| EP | 91480009.9 | 7/1992 |
| EP | 93203072.9 | 5/1994 |
| JP | 2-192300 | 7/1999 |
| WO | WO 83/02212 | 6/1983 |
| WO | WO 89/04583 | 5/1989 |
| WO | WO 95/08248 | 3/1995 |
| WO | WO 97/14266 | 4/1997 |

OTHER PUBLICATIONS

Lunner, Thomas and Hellgren, Johan, "A Digital Filterbank Hearing Aid–Design, Implementation and Evaluation", Department of Electronic Engineering and Department of Otorhinolaryngology, University of Linkoping, Sweden, pp. 3661–3664, 1991.

Lee, Jo–Hong and Kang, Wen–Juh, "Filter Design for Polyphase Filter Banks with Arbitrary Number of Subband Channels", Department of Electrical Engineering, National Taiwan University, Taipei, Taiwan, Republic of China, pp. 1720–1723, 1989.

*Primary Examiner*—David C. Mis
(74) *Attorney, Agent, or Firm*—Jones Day

(57) ABSTRACT

A precision, low jitter oscillator circuit is provided that is particularly well-suited for generating a clock signal in miniature digital systems, such as digital hearing aids. The oscillator includes a plurality of differential inverters configured in a feedback loop to generate an oscillating clock signal. The differential inverters include a capacitive trimming network for adjusting the frequency of the oscillating clock signal and employ resistive loads for minimizing jitter in the clock signal. The components of the oscillator are fabricated in a common silicon process to minimize the size of the oscillator.

26 Claims, 5 Drawing Sheets

U.S. PATENT DOCUMENTS

| | | |
|---|---|---|
| 4,187,413 A | 2/1980 | Moser |
| 4,289,935 A | 9/1981 | Zollner et al. |
| 4,403,118 A | 9/1983 | Zollner et al. |
| 4,471,171 A | 9/1984 | Köpke et al. |
| 4,508,940 A | 4/1985 | Steeger |
| 4,592,087 A | 5/1986 | Killion |
| 4,689,818 A | 8/1987 | Ammitzboll |
| 4,689,820 A | 8/1987 | Kopke et al. |
| 4,696,032 A | 9/1987 | Levy |
| 4,712,244 A | 12/1987 | Zwicker et al. |
| 4,750,207 A | 6/1988 | Gebert et al. |
| 4,852,175 A | 7/1989 | Kates |
| 4,868,880 A | 9/1989 | Bennett, Jr. |
| 4,882,762 A | 11/1989 | Waldhauer |
| 4,947,432 A | 8/1990 | Tpholm |
| 4,947,433 A | 8/1990 | Gebert |
| 4,953,216 A | 8/1990 | Beer |
| 4,989,251 A | 1/1991 | Mangold |
| 4,995,085 A | 2/1991 | Kern et al. |
| 5,029,217 A | 7/1991 | Chabries et al. |
| 5,046,102 A | 9/1991 | Zwicker et al. |
| 5,111,419 A | 5/1992 | Morley, Jr. et al. |
| 5,144,674 A | 9/1992 | Meyer et al. |
| 5,189,704 A | 2/1993 | Krauss |
| 5,201,006 A | 4/1993 | Weinrich |
| 5,202,927 A | 4/1993 | Topholm |
| 5,210,803 A | 5/1993 | Martin et al. |
| 5,241,310 A | 8/1993 | Tiemann |
| 5,247,581 A | 9/1993 | Gurcan |
| 5,276,739 A | 1/1994 | Krokstad et al. |
| 5,278,912 A | 1/1994 | Waldhauer |
| 5,347,587 A | 9/1994 | Takahashi et al. |
| 5,376,892 A | 12/1994 | Gata |
| 5,389,829 A | 2/1995 | Milazzo |
| 5,448,644 A | 9/1995 | Pfannenmueller et al. |
| 5,479,522 A | 12/1995 | Lindemann et al. |
| 5,500,902 A | 3/1996 | Stockham, Jr. et al. |
| 5,515,443 A | 5/1996 | Meyer |
| 5,524,150 A | 6/1996 | Sauer |
| 5,561,398 A * | 10/1996 | Rasmussen ............... 331/36 C |
| 5,604,812 A | 2/1997 | Meyer |
| 5,608,803 A | 3/1997 | Magotra et al. |
| 5,613,008 A | 3/1997 | Martin |
| 5,649,019 A | 7/1997 | Thomasson |
| 5,661,814 A | 8/1997 | Kälin et al. |
| 5,687,241 A | 11/1997 | Ludvigsen |
| 5,706,351 A | 1/1998 | Weinfurtner |
| 5,710,820 A | 1/1998 | Martin et al. |
| 5,717,770 A | 2/1998 | Weinfurtner |
| 5,719,528 A | 2/1998 | Rasmussen et al. |
| 5,754,661 A | 5/1998 | Weinfurtner |
| 5,796,848 A | 8/1998 | Martin |
| 5,809,151 A | 9/1998 | Husung |
| 5,815,102 A | 9/1998 | Melanson |
| 5,838,801 A | 11/1998 | Ishige et al. |
| 5,838,806 A | 11/1998 | Sigwanz et al. |
| 5,862,238 A | 1/1999 | Agnew et al. |
| 5,878,146 A | 3/1999 | Andersen |
| 5,896,101 A | 4/1999 | Melanson |
| 5,912,977 A | 6/1999 | Gottschalk-Schoenig |
| 6,005,954 A | 12/1999 | Weinfurtner |
| 6,044,162 A | 3/2000 | Mead et al. |
| 6,044,163 A | 3/2000 | Weinfurtner |
| 6,049,617 A | 4/2000 | Sigwanz et al. |
| 6,049,618 A | 4/2000 | Saltkov |
| 6,108,431 A | 8/2000 | Bachler |
| 6,175,635 B1 | 1/2001 | Meyer et al. |
| 6,198,830 B1 | 3/2001 | Holube et al. |
| 6,236,731 B1 | 5/2001 | Brennan et al. |
| 6,240,192 B1 | 5/2001 | Brennan et al. |
| 6,240,195 B1 | 5/2001 | Bindner et al. |
| 6,272,229 B1 | 8/2001 | Baekgaard |
| 6,369,661 B1 * | 4/2002 | Scott et al. ................... 331/45 |

* cited by examiner

PRECISION LOW JITTER OSCILLATOR CIRCUIT

BACKGROUND

1. Field of the Invention

This invention generally relates to oscillator circuits. More specifically, the invention provides a precision, low jitter oscillator circuit that is particularly well-suited for generating clock signals used in digital systems, such as a digital hearing aid system. The invention provides utility, however, in any circuit application that requires a precision, low jitter clock source.

2. Description of the Related Art

Oscillators for generating clock signals are known. The two most common types of oscillators are crystal oscillators and ring oscillators. A crystal oscillator is a piezo-electric device that resonates at a particular frequency when a voltage is applied to the crystal. Although some crystals can provide low jitter performance, the mechanical dimensions of the crystal typically limit its applicability in miniaturized circuitry, such as digital hearing aids, implantable bio-electric devices and probes, and/or any other miniature electronic device.

Ring oscillators are generally composed of a plurality of logic gates. The logic gates are typically differential inverters that are configured in a feedback loop in order to provide an oscillation output signal. The cumulative delay through the plurality of differential inverters determines the frequency of the oscillation output signal. These differential inverters, however, typically employ active loads (i.e., transistor devices) in their output stages. The active loads limit the low jitter performance of the oscillator such that to achieve low jitter on the output clock signal, the differential inverters must be operated with a relatively high supply voltage, such as 3 to 5 volts. Miniaturized circuitry, however, typically includes only a low voltage supply, such as a 1.3 volt single battery supply, and thus these known oscillators are of limited utility. Furthermore, in order to modify the frequency of the output clock signal, these active-load differential inverters typically employ an adjustable current source, which further adds to the power consumption of the circuitry. For these reasons, ring oscillators employing differential inverters with active loads have been difficult to integrate into a miniaturized circuit application. (See, for example, A. Hajimire, S. Limotyrakis, and T. H. Lee, *"Jitter and Phase Noise in Ring Oscillators,"* IEEE Journal of Solid-State Circuits, Vol. 34, No. 6, June 1999, pp. 790–804).

A digital hearing aid system needs an oscillator as a clock reference. The clock must have low jitter to ensure a high signal-to-noise ratio ("S/N") of both the analog-to-digital ("A/D") converter, and also the digital-to-analog ("D/A") converter that are typically included in the hearing aid. Power consumption in this type of system should be minimized since the entire device is typically powered from a 1.3 volt zinc-air hearing aid battery. Other requirements of this type of system include small size and clock precision.

SUMMARY

A precision, low jitter oscillator circuit is provided that is particularly well-suited for generating a clock signal in miniature digital systems, such as digital hearing aids. The oscillator includes a plurality of differential inverters configured in a feedback loop to generate an oscillating clock signal. The differential inverters include a capacitive trimming network for adjusting the frequency of the oscillating clock signal and employ resistive loads for minimizing jitter in the clock signal. The components of the oscillator are fabricated in a common silicon process to minimize the size of the oscillator.

DETAILED DESCRIPTION OF THE DRAWINGS

Figure 1A:
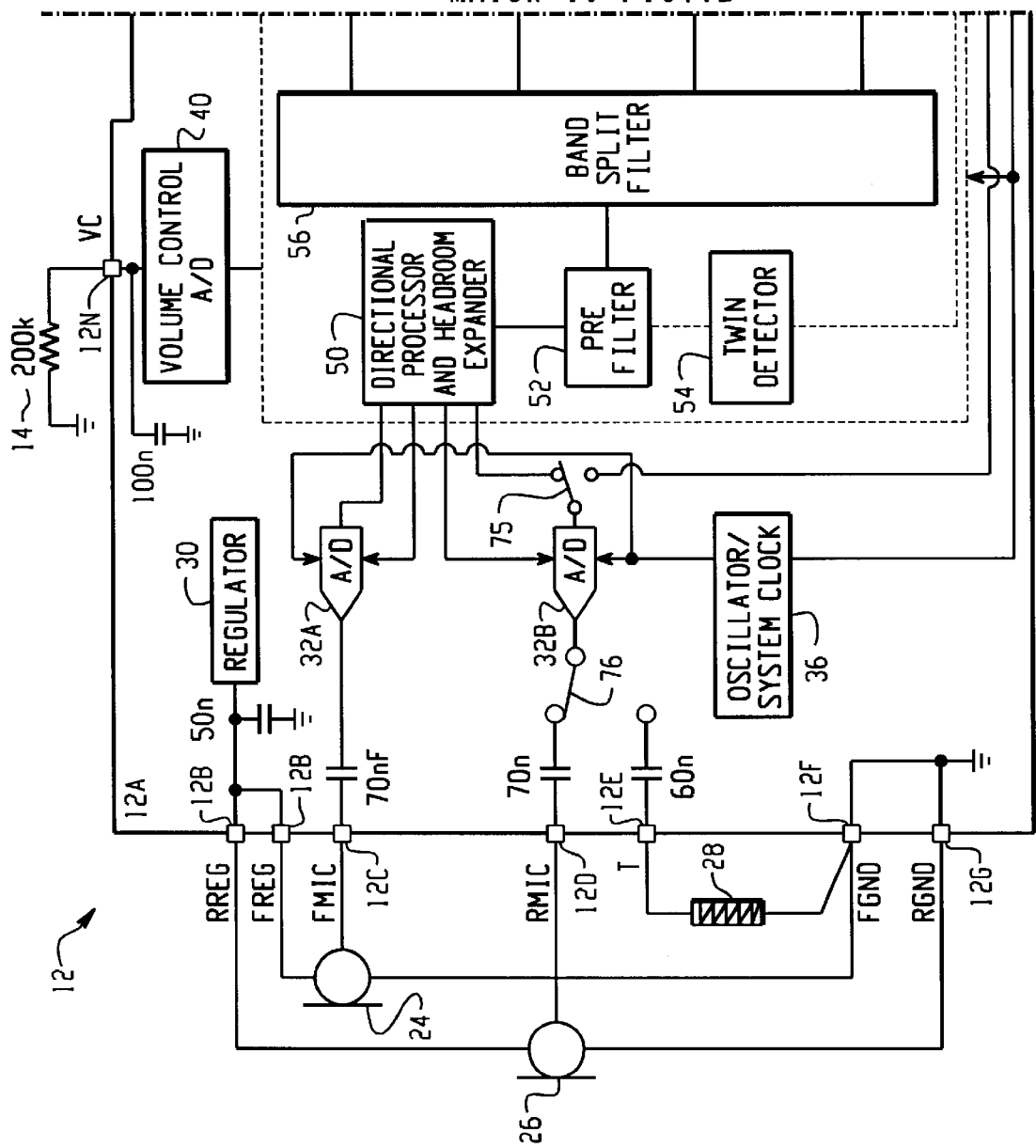
FIG. 1 is a block diagram of an exemplary digital hearing aid system incorporating a precision, low jitter oscillator circuit according to the present invention.
Figure 1B:
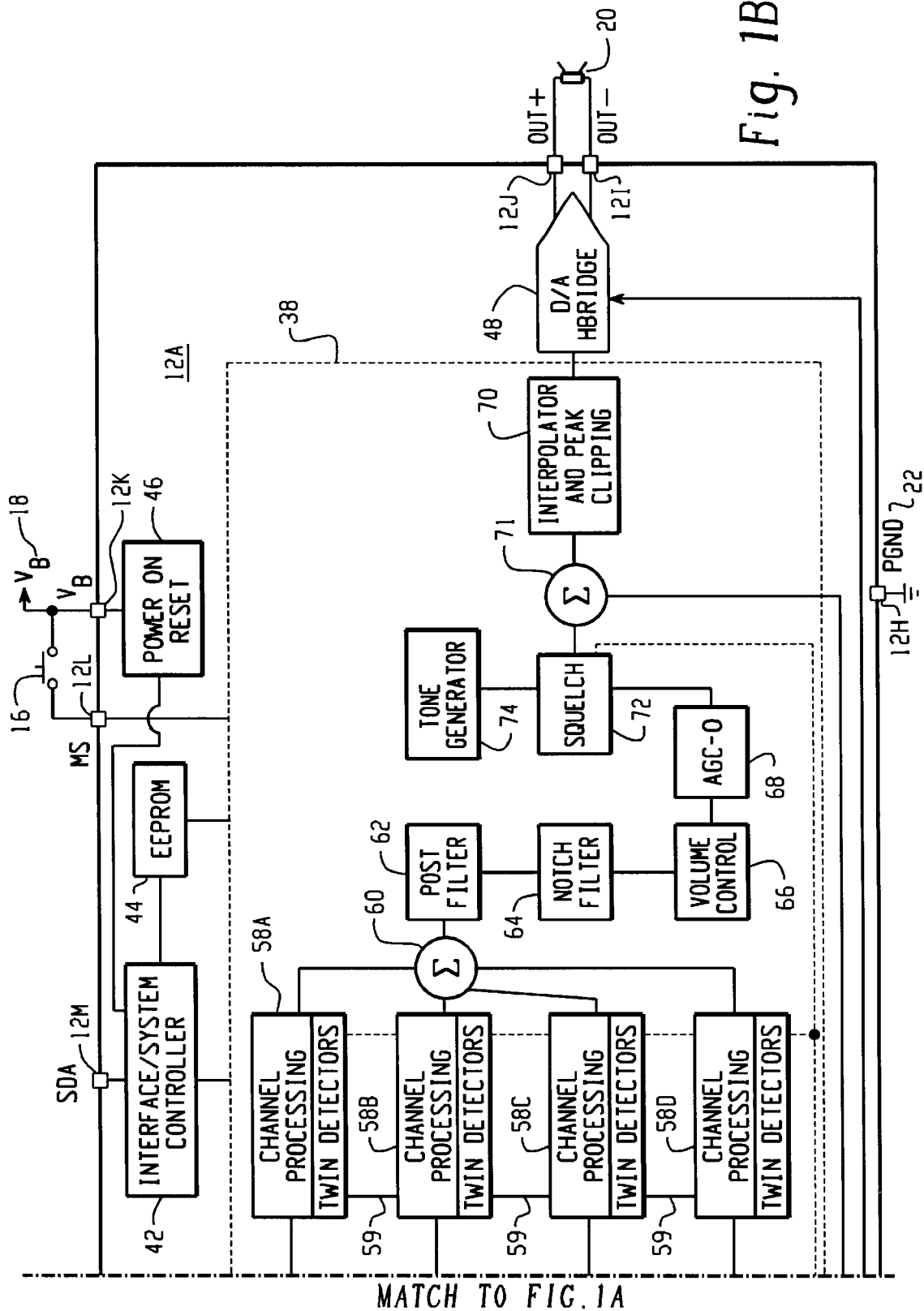

Turning now to the drawing figures, FIG. 1 is a block diagram of an exemplary digital hearing aid system 12 incorporating a precision, low jitter oscillator circuit 26 according to the present invention. It should be understood, however, that this digital hearing aid system 12 is just one of many applications for the precision, low jitter oscillator circuit 26 described herein.

The digital hearing aid system 12 includes several external components 14, 16, 18, 20, 22, 24, 26, 28, and, preferably, a single integrated circuit (IC) 12A. The external components include a pair of microphones 24, 26, a tele-coil 28, a volume control potentiometer 24, a memory-select toggle switch 16, battery terminals 18, 22, and a speaker 20.

Sound is received by the pair of microphones 24, 26, and converted into electrical signals that are coupled to the FMIC 12C and RMIC 12D inputs to the IC 12A. FMIC refers to "front microphone," and RMIC refers to "rear microphone." The microphones 24, 26 are biased between a regulated voltage output from the RREG and FREG pins 12B, and the ground nodes FGND 12F, RGND 12G. The regulated voltage output on FREG and RREG is generated internally to the IC 12A by regulator 30.

The tele-coil 28 is a device used in a hearing aid that magnetically couples to a telephone handset and produces an input current that is proportional to the telephone signal. This input current from the tele-coil 28 is coupled into the rear microphone A/D converter 32B on the IC 12A when the switch 76 is connected to the "T" input pin 12E, indicating that the user of the hearing aid is talking on a telephone. The tele-coil 28 is used to prevent acoustic feedback into the system when talking on the telephone.

The volume control potentiometer 14 is coupled to the volume control input 12N of the IC 12A. This variable resistor is used to set the volume sensitivity of the digital hearing aid.

The memory-select toggle switch 16 is coupled between the positive voltage supply VB 18 to the IC 12A and the memory-select input pin 12L. This switch 16 is used to toggle the digital hearing aid system 12 between a series of setup configurations. For example, the device may have been previously programmed for a variety of environmental settings, such as quiet listening, listening to music, a noisy setting, etc. For each of these settings, the system parameters of the IC 12A may have been optimally configured for the particular user. By repeatedly pressing the toggle switch 16, the user may then toggle through the various configurations stored in the read-only memory 44 of the IC 12A.

The battery terminals 12K, 12H of the IC 12A are preferably coupled to a single 1.3 volt zinc-air battery. This battery provides the primary power source for the digital hearing aid system.

The last external component is the speaker 20. This element is coupled to the differential outputs at pins 12J, 12I of the IC 12A, and converts the processed digital input signals from the two microphones 24, 26 into an audible signal for the user of the digital hearing aid system 12.

There are many circuit blocks within the IC 12A. Primary sound processing within the system is carried out by the sound processor 38. A pair of A/D converters 32A, 32B are coupled between the front and rear microphones 24, 26, and the sound processor 38, and convert the analog input signals into the digital domain for digital processing by the sound processor 38. A single D/A converter 48 converts the processed digital signals back into the analog domain for output by the speaker 20. Other system elements include a regulator 30, a volume control A/D 40, an interface/system controller 42, an EEPROM memory 44, a power-on reset circuit 46, and a oscillator/system clock 36. The oscillator/system clock 36 is discussed in more detail below with respect to FIGS. 2–6.

The sound processor 38 preferably includes a directional processor 50, a pre-filter 52, a wide-band twin detector 54, a band-split filter 56, a plurality of narrow-band channel processing and twin detectors 58A–58D, a summer 60, a post filter 62, a notch filter 64, a volume control circuit 66, an automatic gain control output circuit 68, a peak clipping circuit 70, a squelch circuit 72, and a tone generator 74.

Operationally, the sound processor 38 processes digital sound as follows. Sound signals input to the front and rear microphones 24, 26 are coupled to the front and rear A/D converters 32A, 32B, which are preferably Sigma-Delta modulators followed by decimation filters that convert the analog sound inputs from the two microphones into a digital equivalent. Note that when a user of the digital hearing aid system is talking on the telephone, the rear A/ID converter 32B is coupled to the tele-coil input "T" 12E via switch 76. Both of the front and rear A/D converters 32A, 32B are clocked with the output clock signal from the oscillator/system clock 36 (discussed in more detail below). This same output clock signal is also coupled to the sound processor 38 and the D/A converter 48.

The front and rear digital sound signals from the two A/D converters 32A, 32B are coupled to the directional processor and headroom expander 50 of the sound processor 38. The rear A/D converter 32B is coupled to the processor 50 through switch 75. In a first position, the switch 75 couples the digital output of the rear A/D converter 32 B to the processor 50, and in a second position, the switch 75 couples the digital output of the rear A/D converter 32B to summation block 71 for the purpose of compensating for occlusion.

Occlusion is the amplification of the users own voice within the ear canal. The rear microphone can be moved inside the ear canal to receive this unwanted signal created by the occlusion effect. The occlusion effect is usually reduced in these types of systems by putting a mechanical vent in the hearing aid. This vent, however, can cause an oscillation problem as the speaker signal feeds back to the microphone(s) through the vent aperture. The system shown in FIG. 1 solves this problem by canceling the unwanted signal received by the rear microphone 26 by feeding forward the rear signal from the A/D converter 32B to summation circuit 71. The summation circuit 71 then subtracts the unwanted signal from the processed composite signal to thereby compensate for the occlusion effect.

The directional processor and headroom expander 50 includes a combination of filtering and delay elements that, when applied to the two digital input signals, forms a single, directionally-sensitive response. This directionally-sensitive response is generated such that the gain of the directional processor 50 will be a maximum value for sounds coming from the front microphone 24 and will be a minimum value for sounds coming from the rear microphone 26.

The headroom expander portion of the processor 50 significantly extends the dynamic range of the A/D conversion, which is very important for high fidelity audio signal processing. It does this by dynamically adjusting the A/D converters 32A/32B operating points. The headroom expander 50 adjusts the gain before and after the A/D conversion so that the total gain remains unchanged, but the intrinsic dynamic range of the A/D converter block 32A/32B is optimized to the level of the signal being processed.

The output from the directional processor and headroom expander 50 is coupled to a pre-filter 52, which is a general-purpose filter for pre-conditioning the sound signal prior to any further signal processing steps. This "pre-conditioning" can take many forms, and, in combination with corresponding "post-conditioning" in the post filter 62, can be used to generate special effects that may be suited to only a particular class of users. For example, the pre-filter 52 could be configured to mimic the transfer function of the user's middle ear, effectively putting the sound signal into the "cochlear domain." Signal processing algorithms to correct a hearing impairment based on, for example, inner hair cell loss and outer hair cell loss, could be applied by the sound processor 38. Subsequently, the post-filter 62 could be configured with the inverse response of the pre-filter 52 in order to convert the sound signal back into the "acoustic domain" from the "cochlear domain." Of course, other pre-conditioning/post-conditioning configurations and corresponding signal processing algorithms could be utilized.

The pre-conditioned digital sound signal is then coupled to the band-split filter 56, which preferably includes a bank of filters with variable corner frequencies and pass-band gains. These filters are used to split the single input signal into four distinct frequency bands. The four output signals from the band-split filter 56 are preferably in-phase so that when they are summed together in block 60, after channel processing, nulls or peaks in the composite signal (from the summer) are minimized.

Channel processing of the four distinct frequency bands from the band-split filter 56 is accomplished by a plurality of channel processing/twin detector blocks 58A–58D. Although four blocks are shown in FIG. 1, it should be clear that more than four (or less than four) frequency bands could be generated in the band-split filter 56, and thus more or less than four channel processing/twin detector blocks 58 may be utilized with the system.

Each of the channel processing/twin detectors 58A–58D provide an automatic gain control ("AGC") function that provides compression and gain on the particular frequency band (channel) being processed. Compression of the channel signals permits quieter sounds to be amplified at a higher gain than louder sounds, for which the gain is compressed. In this manner, the user of the system can hear the full range of sounds since the circuits 58A–58D compress the full range of normal hearing into the reduced dynamic range of the individual user as a function of the individual user's hearing loss within the particular frequency band of the channel.

The channel processing blocks 58A–58D can be configured to employ a twin detector average detection scheme while compressing the input signals. This twin detection scheme includes both slow and fast attack/release tracking modules that allow for fast response to transients (in the fast tracking module), while preventing annoying pumping of the input signal (in the slow tracking module) that only a fast time constant would produce. The outputs of the fast and slow tracking modules are compared, and the compression slope is then adjusted accordingly. The compression ratio, channel gain, lower and upper thresholds (return to linear point), and the fast and slow time constants (of the fast and slow tracking modules) can be independently programmed and saved in memory 44 for each of the plurality of channel processing blocks 58A–58D.

FIG. 1 also shows a communication bus 59, which may include one or more connections, for coupling the plurality of channel processing blocks 58A–58D. This inter-channel communication bus 59 can be used to communicate information between the plurality of channel processing blocks 58A–58D such that each channel (frequency band) can take into account the "energy" level (or some other measure) from the other channel processing blocks. Preferably, each channel processing block 58A–58D would take into account the "energy" level from the higher frequency channels. In addition, the "energy" level from the wide-band detector 54 may be used by each of the relatively narrow-band channel processing blocks 58A–58D when processing their individual input signals.

After channel processing is complete, the four channel signals are summed by summer 60 to form a composite signal. This composite signal is then coupled to the post-filter 62, which may apply a post-processing filter function as discussed above. Following post-processing, the composite signal is then applied to a notch-filter 64, that attenuates a narrow band of frequencies that is adjustable in the frequency range where hearing aids tend to oscillate. This notch filter 64 is used to reduce feedback and prevent unwanted "whistling" of the device. Preferably, the notch filter 64 may include a dynamic transfer function that changes the depth of the notch based upon the magnitude of the input signal.

Following the notch filter 64, the composite signal is then coupled to a volume control circuit 66. The volume control circuit 66 receives a digital value from the volume control A/D 40, which indicates the desired volume level set by the user via potentiometer 14, and uses this stored digital value to set the gain of an included amplifier circuit.

From the volume control circuit, the composite signal is then coupled to the AGC-output block 68. The AGC-output circuit 68 is a high compression ratio, low distortion limiter that is used to prevent pathological signals from causing large scale distorted output signals from the speaker 20 that could be painful and annoying to the user of the device. The composite signal is coupled from the AGC-output circuit 68 to a squelch circuit 72, that performs an expansion on low-level signals below an adjustable threshold. The squelch circuit 72 uses an output signal from the wide-band detector 54 for this purpose. The expansion of the low-level signals attenuates noise from the microphones and other circuits when the input S/N ratio is small, thus producing a lower noise signal during quiet situations. Also shown coupled to the squelch circuit 72 is a tone generator block 74, which is included for calibration and testing of the system.

The output of the squelch circuit 72 is coupled to one input of summer 71. The other input to the summer 71 is from the output of the rear A/D converter 32B, when the switch 75 is in the second position. These two signals are summed in summer 71, and passed along to the interpolator and peak clipping circuit 70. This circuit 70 also operates on pathological signals, but it operates almost instantaneously to large peak signals and is high distortion limiting. The interpolator shifts the signal up in frequency as part of the D/A process and then the signal is clipped so that the distortion products do not alias back into the baseband frequency range.

The output of the interpolator and peak clipping circuit 70 is coupled from the sound processor 38 to the D/A H-Bridge 48. This circuit 48 converts the digital representation of the input sound signals to a pulse density modulated representation with complimentary outputs. These outputs are coupled off-chip through outputs 12J, 12l to the speaker 20, which low-pass filters the outputs and produces an acoustic analog of the output signals. The D/A H-Bridge 48 includes an interpolator, a digital Delta-Sigma modulator, and an H-Bridge output stage. The D/A H-Bridge 48 is also coupled to and receives the clock signal from the oscillator/system clock 36 (described below).

The interface/system controller 42 is coupled between a serial data interface pin 12M on the IC 12, and the sound processor 38. This interface is used to communicate with an external controller for the purpose of setting the parameters of the system. These parameters can be stored on-chip in the EEPROM 44. If a "black-out" or "brown-out" condition occurs, then the power-on reset circuit 46 can be used to signal the interface/system controller 42 to configure the system into a known state. Such a condition can occur, for example, if the battery fails.

Figure 2:
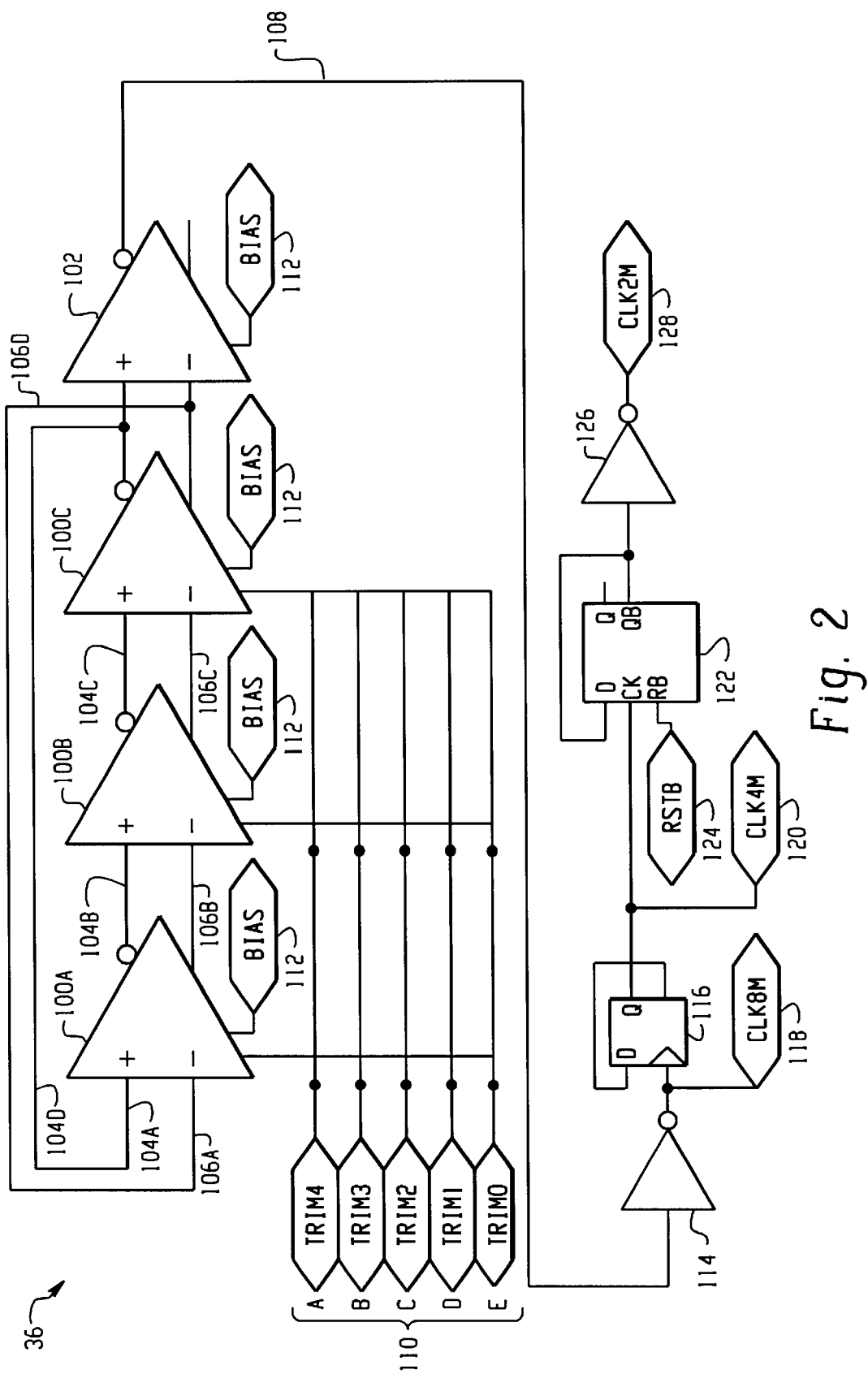
FIG. 2 is a circuit schematic of an exemplary precision, low jitter oscillator circuit according to the present invention.

Turning now to the remaining drawing figures, FIG. 2 is a circuit schematic of an exemplary precision, low jitter oscillator circuit 36 according to the present invention. This oscillator circuit can be used, for example, as the oscillator/system clock 36 shown in FIG. 1 for the digital hearing aid system.

The preferred oscillator 36 includes a plurality of differential inverters 100A–100C, which are configured in a feedback loop to generate an oscillation signal, a differential-to-single-ended comparator 102, an inverter 114, a first D flip-flop 116, a second D flip-flop 122, and an inverter 126.

Each of the differential inverters 100A–100C includes a pair of inputs 104A/106A to 104C/106C and a pair of outputs 104B/106B to 104D/106D. The outputs from the third differential inverter 100C are fed back as the inputs to the first differential inverter 100A, which results in an oscillating output signal pair 104D/106D. The preferred differential inverter circuit 100A–100C is described below in connection with FIGS. 3–4.

The differential inverters 100A–100C each comprise a delay stage in the oscillator. The time duration of this delay determines the oscillation frequency of the oscillator. Although three delay stages 100A–100C are shown in FIG.

2, the oscillator could have more than three stages. Each of the delay stages 100A–100C and the comparator circuit 102 are biased using a common bias signal 112 that is generated by the bias circuit shown in FIG. 5.

Also coupled to each of the differential inverters 100A–100C is a digital trimming word 110 comprising a plurality of digital trimming bits (TRIM0–TRIM4). As described in more detail below, these digital trimming bits are used to alter the delay of the differential inverters 100A–100C, and thus alter the oscillation frequency of the oscillator.

The differential oscillation output signals 104D/106D are coupled to the comparator 102, which converts the differential oscillation output signals into a single-ended oscillation output signal 108. This signal 108 is then coupled to an inverter 114, which further amplifies the oscillation signal 108. The output of this inverter 114 is a node labeled "CLK8M," indicating that the oscillator is preferably set to generate an 8 MHz output clock signal. The first D flip flop 116 is configured to divide the 8 MHz clock in two in order to generate a 4 MHz clock signal, at node "CLK4M." This 4 MHz signal is further divided by two in the second D flip flop 122 to generate a 2 MHz clock signal "CLK2M," which is used by the A/D and D/A converters 32A, 32B, 48 in the digital hearing aid shown in FIG. 1. The second D flip flop 122 also receives a reset signal "RSTB" from a controller. The reset signal is used to synchronize the 2 MHz clock with other external clock signals in the system. By using an 8 MHz oscillation frequency and then dividing down to achieve the desired 2 MHz system clock for the digital hearing aid system, jitter is reduced and smaller components can be used in the oscillator 36.

Figure 3:
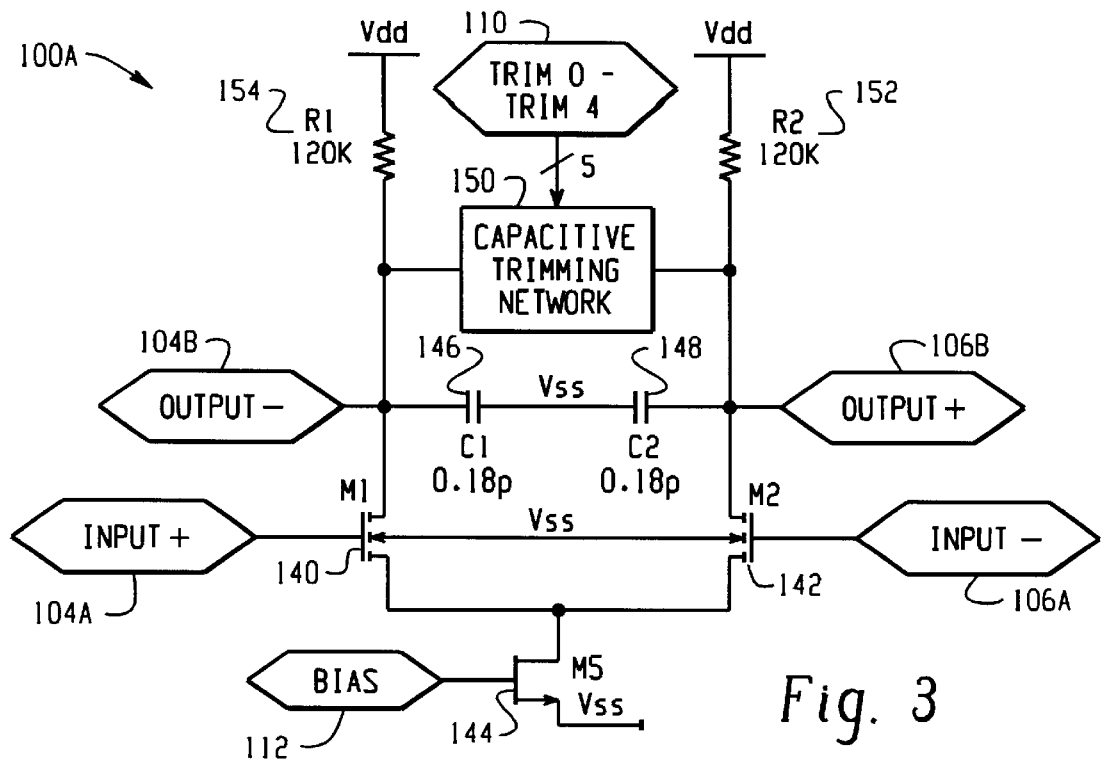
FIG. 3 is a circuit schematic of an exemplary differential inverter stage having a digital capacitive trimming network for use with the precision, low jitter oscillator circuit shown in FIG. 2.

FIG. 3 is a circuit schematic of an exemplary differential inverter stage 100A having a digital capacitive trimming network 150 for use with the precision, low jitter oscillator circuit shown in FIG. 2. The differential inverter stage 100A includes a pair of input NMOS transistors M1 140, M2 142, a biasing NMOS device M5 144, a pair of base delay capacitors C1, C2 146, 148, a pair of resistor loads R1, R2 154, 152, and a digital capacitive trimming network 150.

The two NMOS transistors M1, M2 are source-coupled to the drain of NMOS transistor M5, which generates a constant bias current that is split among M1 and M2. The constant bias current is determined by the bias voltage level 112 input to the gate of NMOS device M5 from the bias circuit, shown in FIG. 5. The gate of M1 is coupled to the positive input node 104A, and the gate of M2 is coupled to the negative input node 106A. The drain of M1 is coupled to the negative output node 104B, and the drain of M2 is coupled to the positive output node 106B. These output nodes 106B, 104B are coupled together via the base delay capacitors C1, C2 146, 148, and the capacitive trimming network 150, 10 described in more detail below in connection with FIG. 4. The output nodes 104B/106B are coupled to the Vdd power supply through resistive loads R1, R2 154, 152.

The input transistors M1, M2 are preferably large area devices in order to reduce 1/f noise, and employ large width/length ("W/L") ratios on the gate structure in order to increase transconductance. The large size of these devices also provides large parasitic capacitance, which combine with the base delay capacitors C1, C2 146, 148.

Load resistors R1 and R2 are monolithic resistors fabricated from the same silicon process that is used to make the NMOS devices, the capacitors, and all of the other circuit elements of the oscillator 36. Preferably, these resistors R1, R2 are manufactured from narrow width, high-resistivity material (i.e., non-salicided polysilicon), with low parasitic capacitance. The load resistors determine the DC operating point of the inverter. By using resistive loads instead of active loads (i.e., PMOS transistors), the inverter 100A exhibits lower 1/f noise (which leads to improved low jitter) and improved precision.

The capacitive trimming network 150 receives, as inputs, the digital trimming bits 110. As shown below in connection with FIG. 4, these digital trimming bits operate a series of NMOS pass transistors that connect a set of binary-weighted capacitors between the two output nodes 104B/106B to thereby alter the capacitance between the output nodes. The total capacitance between these two output nodes ($C_L$) determines the delay through the inverter, and thus the oscillation frequency of the oscillator ($f_{OSC}$).

The oscillation frequency may be calculated as follows. Assume one inverter has a delay of τ. Since the number of delay stages in the example oscillator shown in FIG. 2 is n=3, the output frequency, $f_{OSC}$, is given by:

$$f_{OSC} = \frac{1}{2n\tau} \quad (1)$$

Since $$\tau \propto \frac{C_L}{g_m}, \quad (2)$$

then $f_{OSC} \propto \frac{g_m}{C_L}$ (3)

where $g_m$ is the transconductance of M1 or M2, and $C_L$ is the load capacitance at the output nodes 104B/106B. $C_L$ includes the base delay capacitor C1 or C2, the parasitic capacitance of the input transistors, and the capacitance added by the capacitive trimming network 150 when set in the nominal frequency setting.

Low jitter in the differential inverter is achieved by using resistive loads (instead of active loads), and by optimizing the design of the active devices and their signal swings. The transistors M1, M2 of the differential inverter 100A are preferably scaled so that the input and output levels of each stage 100A–100C are matched. By utilizing wide channel devices, the operating point of the inverter stage is optimized to maximize signal swing and to prevent triode operation of the transistors. Optimizing the signal swing in this manner improves the dv/dt performance of the inverter at a particular frequency so that input noise has minimum impact on jitter.

Figure 4:
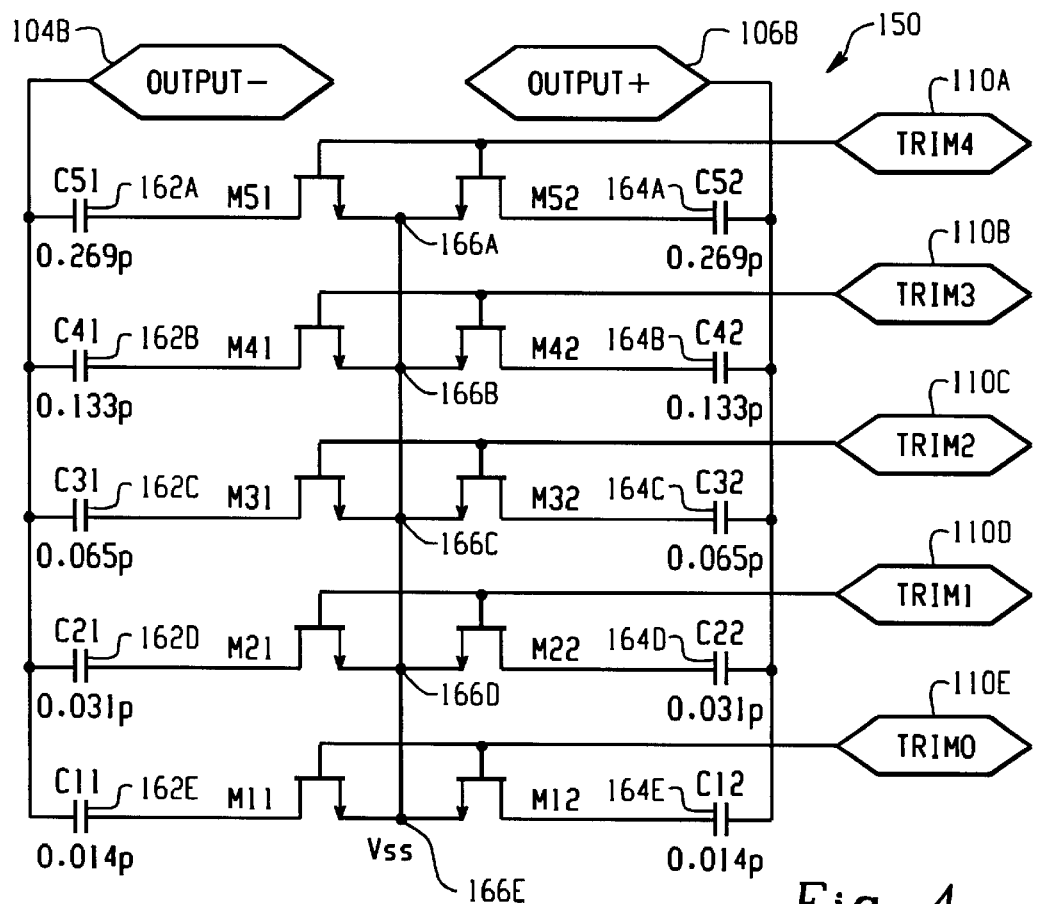
FIG. 4 is a more detailed circuit schematic of an exemplary digital capacitive trimming network used in the differential inventor stage shown in FIG. 3.

FIG. 4 is a more detailed circuit schematic of an exemplary digital capacitive trimming network 150 used in the differential inverter stage shown in FIG. 3. This circuit 150 is coupled between the output nodes 104B/106B, and includes a plurality of binary weighted capacitors C11–C52, which are coupled between the output nodes 104B/106B via pass transistors M11–M52. The gates of the NMOS pass transistors are coupled to the digital trimming bits 110 (TRIM0-TRIM 4).

The first level of binary weighted capacitors is the combination of C11 and C12. Each of these capacitors preferably contributes 0.014 picofarads of capacitance to the base capacitors C1, C2, which are preferably 0.18 picofarads. The first level capacitance is added to the base capacitance by asserting a positive logic level on trimming bit TRIM0 110E. When TRIM0 is positive, the pass transistors M11 and M12 are turned on, thus coupling the two capacitors together between the output nodes 104B/106B.

Likewise, the second, third, fourth and fifth levels of binary weighted capacitors operate to add capacitance between the output nodes 104B, 106B when the corresponding digital trimming bits are activated. Preferably, the second level capacitors C21, C22 are 0.031 picofarads, the third level capacitors C31, C32 are 0.065 picofarads, the fourth level capacitors C41, C42 are 0.133 picofarads, and the fifth level capacitors C51, C52 are 0.269 picofarads. By appropriately activating the five digital trimming bits (TRIM0-TRIM 4), thirty-two levels of capacitance (between just TRIM0 activated, and all five bits activated) can be added to the base capacitance provided by C1, C2. The five trimming bits provide a frequency adjustment of +/−2.5% of nominal with a range of about +114% to −45%. Although five digital trimming bits, and five sets of trimming capacitors are preferred, it should be understood that any number of trimming levels and trimming capacitor sets could be used with the present invention.

Nominally, the five trimming bits are configured to generate the nominal frequency of the oscillator. Preferably, this is somewhere between the eighth and twentieth level of the thirty-two possible levels for the trimming bits. In the preferred embodiment shown in FIGS. 1 and 2, this nominal frequency is 8 MHz. By configuring the trimming bits in this manner, the nominal frequency can be adjusted up and down from the nominal level.

Figure 5:
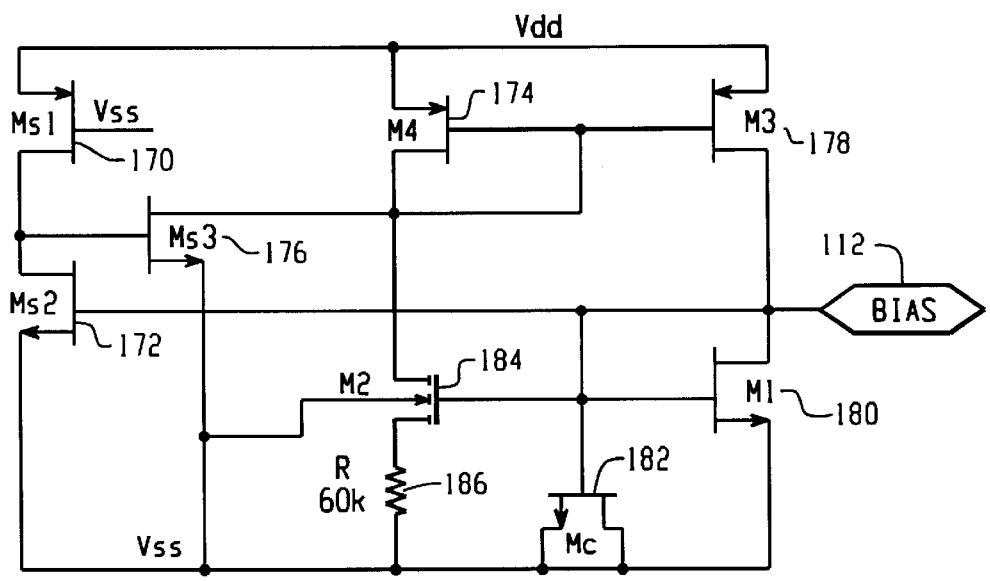
FIG. 5 is a more detailed circuit schematic of an exemplary bias circuit for use with the precision, low jitter oscillator circuit shown in FIG. 2.

FIG. 5 is a more detailed circuit schematic of an exemplary bias circuit for use with the precision, low jitter oscillator circuit shown in FIG. 2. This circuit includes MOS devices 170–184 and resistor 186. The circuit is a constant-transconductance bias circuit with current mirrors connected in a pair of feedback loops. The bias voltage level 112 generated by this circuit is applied to the differential inverters 100A–100C and the comparator 102 in order to bias these circuits at the same operating point.

MOS transistors M1–M4 180, 184, 174, 178 and resistor R 186 form the biasing circuitry. The channel length of these devices is selected in order to provide a high power-supply rejection ratio. MOS transistors Ms1, Ms2 and Ms3 170, 172, 176 form a simple start-up circuit for the bias-generating devices. Transistor Mc 182 is configured as a MOS capacitor, and is used to reduce the output noise of the bias voltage 112.

Figure 6:
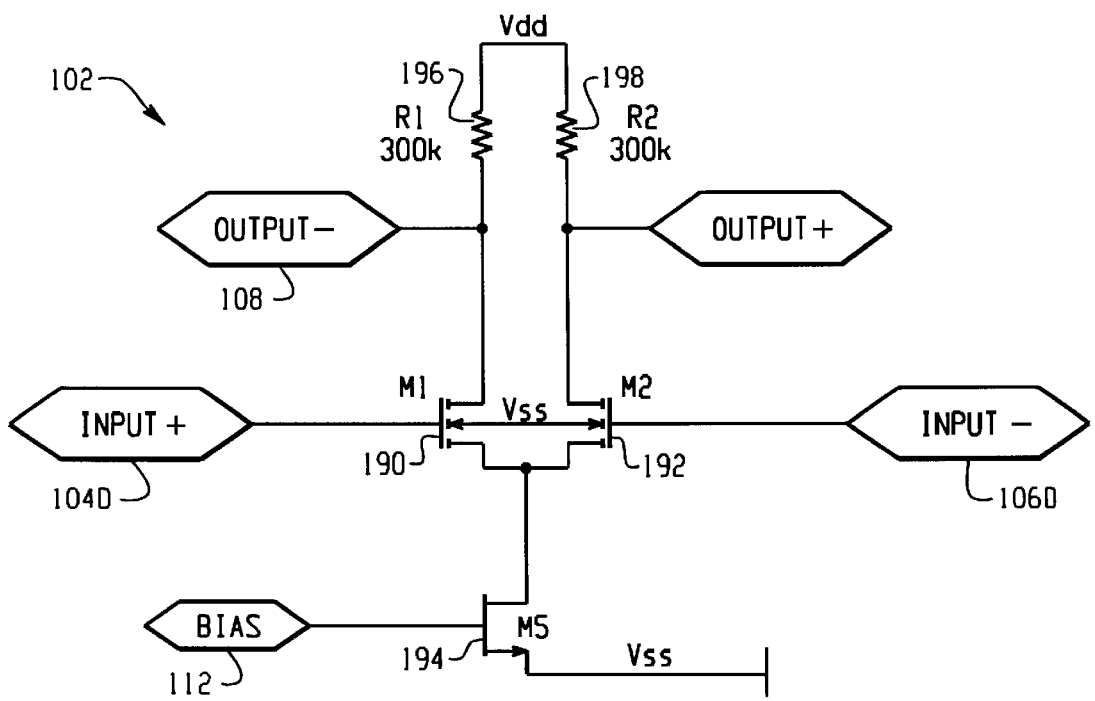
FIG. 6 is a more detailed circuit schematic of an exemplary comparator circuit for use with the precision, low jitter oscillator circuit shown in FIG. 2.

FIG. 6 is a more detailed circuit schematic of an exemplary comparator circuit 102 for use with the precision, low jitter oscillator circuit shown in FIG. 2. The comparator circuit 102 is almost identical to the differential inverter 100A shown in FIG. 3, except that it does not include the capacitors C1, C2 or the capacitive trimming network 150. Although two outputs are shown in FIG. 6, when configured in the oscillator shown in FIG. 2, only the negative output signal 108 is operative in the circuit. Like the differential inverter 100A, the comparator also uses resistive loads R1, R2 in order to reduce 1/f noise, and thus minimize jitter.

The present invention provides many advantages over prior oscillator circuits. Some of these advantages include: (1) no external parts; the components shown in FIGS. 2–4 are all manufactured from the same silicon process, thereby minimizing the size of the oscillator circuit; (2) high precision; by using the capacitive trimming networks, the oscillation frequency can be trimmed to within +/−2.5% of the nominal frequency setting; and (3) low jitter; as explained above, by using resistive loads in the differential inverter, and by optimizing and matching the design of the active devices, jitter is minimized.

Having described an example of the invention by way of the drawing figures, it should be understood that this is just one example, and nothing set forth in this detailed description of the drawings is meant to limit the invention to this one example.

We claim:

1. An oscillator, comprising:
   a plurality of differential inverters configured in a feedback loop to generate an oscillating output signal, each differential inverter including a capacitive trimming network; and
   a plurality of digital trimming bits coupled to the capacitive trimming networks for selecting one or more capacitors in each capacitive trimming network, wherein the delay of each differential inverter is simultaneously adjusted in response to the digital trimming bits.

2. The oscillator of claim 1, further comprising:
   a comparator coupled to one of the differential inverters that converts the oscillating output signal from a differential signal to a single-ended signal.

3. The oscillator of claim 2, further comprising:
   a first divider for dividing the single-ended signal by a factor of 2 to form a first divided signal.

4. The oscillator of claim 3, further comprising:
   a second divider for dividing the first divided signal by a factor of 2 to form a second divided signal.

5. The oscillator of claim 4, wherein the second divider is coupled to a reset signal and includes circuitry to synchronize the second divided signal with an external clock signal.

6. The oscillator of claim 1, further comprising:
   a bias circuit coupled to the plurality of differential inverters for biasing the differential inverters at a common operating point.

7. The oscillator of claim 1, wherein the differential inverters include a pair of inputs and a pair of outputs, an input stage transistor pair coupled between the pair of inputs and the pair of outputs, and a pair of resistive loads coupled to each output in the pair of outputs.

8. The oscillator of claim 7, wherein the differential inverters further include a pair of base capacitors coupled between the pair of outputs, wherein the base capacitors set a base time delay for signals communicated through the differential inverter.

9. The oscillator of claim 8, wherein the capacitive trimming network is coupled in parallel to the base capacitors between the pair of outputs.

10. The oscillator of claim 9, wherein the differential inverters further include a biasing transistor coupled to an external bias signal and the pair of input transistors.

11. The oscillator of claim 1, wherein the oscillating output signal is used to clock at least one A/D converter and at least one D/A converter in a digital hearing aid system.

12. The oscillator of claim 1, wherein the plurality of differential inverters include at least three differential inverters.

13. The oscillator of claim 2, further comprising:
   a bias circuit coupled to the plurality of differential inverters and the comparator for biasing the differential inverters and the comparator at a common operating point.

14. The oscillator of claim 1, wherein the capacitive trimming networks include a plurality of binary weighted capacitors.

15. The oscillator of claim 14, wherein the plurality of binary weighted capacitors are configured in a plurality of binary levels, each binary level including a pair of capacitors and at least one pass transistor, wherein the pass transistor is coupled to one of the digital trimming bits.

16. The oscillator of claim 15, wherein the digital trimming bits turn on and off the pass transistors at each of the binary levels in order to selectively connect the pair of capacitors in each of the binary levels to the differential inverters.

17. The oscillator of claim 16, wherein the plurality of binary levels includes at least five levels.

18. The oscillator of claim 16, wherein the capacitive trimming networks are coupled to an output stage of the differential inverters.

19. The oscillator of claim 7, wherein the pair of resistive loads and the input stage transistor pair are manufactured from a common semiconductor process.

20. The oscillator of claim 19, wherein the pair of resistive loads are made of non-salicided polysilicon.

21. The oscillator of claim 7, wherein the input stage transistor pair are NMOS devices.

22. The oscillator of claim 1, wherein the frequency of the oscillating output signal is varied by selecting one or more of the digital trimming bits.

23. The oscillator of claim 13, wherein the bias circuit is a constant transconductance bias circuit.

24. The oscillator of claim 22, wherein the frequency of the oscillating output signal can be varied by about +/−2.5% from a nominal frequency value via the digital trimming bits.

25. A precision, low jitter oscillator for generating an adjustable clock signal, comprising:
a plurality of differential inverters configured in a feedback loop to generate an oscillating clock signal, each differential inverter including a capacitive trimming network that is coupled to a plurality of digital trimming bits for selecting one or more capacitors in each of the capacitive trimming networks to thereby adjust the frequency of the oscillating clock signal.

26. The precision, low jitter oscillator of claim 25, wherein each of the differential inverters includes and input stage and an output stage, and a resistive load coupled to the output stage for minimizing jitter in the oscillating clock signal.

* * * * *